(12) United States Patent
Alenin

(10) Patent No.: US 7,109,802 B2
(45) Date of Patent: Sep. 19, 2006

(54) BIPOLAR DIFFERENTIAL TO SINGLE ENDED TRANSFER CIRCUIT WITH GAIN BOOST

(75) Inventor: Sergey Alenin, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 142 days.

(21) Appl. No.: 10/927,545

(22) Filed: Aug. 26, 2004

(65) Prior Publication Data

US 2006/0044068 A1    Mar. 2, 2006

(51) Int. Cl.
*H03F 3/45* (2006.01)
(52) U.S. Cl. ............... 330/301; 330/257; 330/260
(58) Field of Classification Search ........ 330/257, 330/260, 301
See application file for complete search history.

(56) References Cited

U.S. PATENT DOCUMENTS 6,127,891 A * 10/2000 Eschauzier et al. ......... 330/255
6,150,833 A * 11/2000 Lin et al. .................... 324/770
6,825,721 B1 * 11/2004 Sanchez et al. ............. 330/253

* cited by examiner

*Primary Examiner*—Steven J. Mottola
(74) *Attorney, Agent, or Firm*—J. Dennis Moore; W. James Brady; Frederick J. Telecky, Jr.

(57) ABSTRACT

A differential to single-ended signal transfer circuit that allows increased gain and improved AC performance while reducing power supply voltage requirements. The transfer circuit includes a first operational transconductance amplifier (OTA), a second operational amplifier (OPA), first and second controlled current sources, a third current source, and first and second bipolar junction transistors. The inverting and non-inverting inputs of the transfer circuit are provided at the inverting input and the non-inverting input, respectively, of the OTA, which is coupled to the first and second controlled current sources to form a current mirror with tracking feedback. The output voltage of the transfer circuit is provided at the emitter of the first transistor, the base of which is connected to the non-inverting input INp. The first transistor is coupled to the third current source in an emitter follower configuration to provide both current gain and impedance matching. The base of the second transistor is connected to the inverting input of the transfer circuit. The OPA is coupled between the respective emitters of the first and second transistors in a voltage follower configuration.

5 Claims, 7 Drawing Sheets

BIPOLAR DIFFERENTIAL TO SINGLE ENDED TRANSFER CIRCUIT WITH GAIN BOOST

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present application relates generally to improvements in differential to single-ended signal transfer circuits, and more specifically to techniques for increasing the open loop gain, for improving the AC performance, and for reducing the power supply voltage requirements of operational amplifiers including such transfer circuits.

Two-stage bipolar operational amplifiers are known that include a differential input stage and a single-ended second stage. For example, a conventional two-stage bipolar operational amplifier (op amp) may include a differential input stage, a differential to single-ended signal transfer circuit, a single-ended second stage, and an output buffer. In the conventional two-stage bipolar op amp, the differential to single-ended transfer circuit may comprise a current mirror, the single-ended second stage may comprise a common emitter circuit, and the output buffer may comprise a voltage follower circuit. Such a two-stage bipolar op amp typically has two high impedance nodes—one at the output of the first stage, and another at the output of the second stage. The conductance associated with these high impedance nodes, which is related to the transconductance of the first and second stages, determines the gain of the respective stages. For example, the gain of each stage may range from about 300 to about 1000, and the open loop gain of the two-stage bipolar op amp may range from about 100,000 to about 1,000,000.

To increase the operating voltage range of the conventional two-stage bipolar op amp, the output buffer may be omitted, and the output of the op amp may be provided at the second stage output. In this way, a two-stage bipolar op amp may be configured having a wide operating voltage range that approaches a rail-to-rail voltage swing. In this configuration, however, the load resistance is applied directly to the second stage output, which can reduce the gain of the second stage to about 10–100 based on the quiescent current level and the load resistance.

One way of increasing the open loop gain of a two-stage bipolar rail-to-rail op amp is to reduce the conductance at the output of the first stage (i.e., the differential input stage) and/or at the input of the second stage. To this end, the differential to single-ended transfer circuit comprising the current mirror may be provided with tracking feedback. For example, FIG. 1a depicts a differential to single-ended transfer circuit 100 comprising a current mirror 102, which includes a diode-connected input transistor Q1 and an output transistor Q2 coupled to the transistor Q1. The transfer circuit 100 further includes a transistor Q3 configured to provide tracking feedback for the current mirror 102, and a current source $I_0$ connected to the respective emitters of the transistors Q1–Q3. As shown in FIG. 1a, the transfer circuit 100 has an inverting input INn at a common base connection 101 of the transistors Q1–Q2, a non-inverting input INp at a base connection 103 of the transistor Q3, and an output Vout at the base connection 103.

FIG. 1b depicts a generalized implementation 100a of the transfer circuit 100, in which a feedback amplifier 104 replaces the transistors Q1–Q3. As shown in FIG. 1b, the inverting input INn of the transfer circuit 100a, which corresponds to the base connection 101 of the transistors Q1–Q2 (see FIG. 1a), is connected to the inverting input of the feedback amplifier 104. Further, the non-inverting input INp of the transfer circuit 100a, which corresponds to the base connection 103 of the transistor Q3 (see FIG. 1a), is connected to the non-inverting input of the feedback amplifier 104. Like the transfer circuit 100, the output of the transfer circuit 100a is provided at the base connection 103. The transfer circuit 100a includes two current sources $I_1$ and $I_2$, both of which are controlled by the feedback amplifier 104.

In general, providing a current mirror with tracking feedback, as depicted in FIGS. 1a–1b, causes the input voltage of the current mirror to be equal to its output voltage, which is controlled by a common feedback loop. Because the input and output voltages of the current mirror are equal to one another, the input and output currents of the current mirror (e.g., the currents flowing through the transistors Q1–Q2, respectively; see FIG. 1a) are equal for any given output voltage Vout, thereby making the differential input well balanced. As a result, the open loop gain of the two-stage bipolar op amp incorporating the transfer circuit 100 or 100a (see FIGS. 1a–1b) can be effectively infinite.

One drawback of the transfer circuits 100 and 100a employing current mirrors with tracking feedback is that the input conductance associated with the single-ended second stage can cause the differential input stage to become imbalanced, thereby degrading the open loop gain of the two-stage bipolar op amp. Current gain can be increased by increasing the number of buffers between the input and the output of the second stage. However, because this approach increases the number of sub-stages within the second stage, the AC performance and the stability of the op amp may be adversely affected.

Another way of increasing the open loop gain of the two-stage bipolar rail-to-rail op amp is to employ a base current cancellation technique. For example, FIG. 2 depicts a differential to single-ended transfer circuit 200 with base current cancellation. The transfer circuit 200 includes transistors Q1–Q2, controlled current sources $I_1$, and $I_2$, and a current source $I_3$. As shown in FIG. 2, the transfer circuit 200 has an inverting input INn at the base of the transistor Q2, a non-inverting input INp at the base of the transistor Q1, and an output Vout at the emitter of the transistor Q1. For example, such a base current cancellation technique may be employed to decrease the input current level of the transfer circuit 200 to about 1/30 of its initial level, while increasing the input impedance of the transfer circuit 200 by a factor of about 30.

However, the base current cancellation technique of FIG. 2 also has drawbacks. For example, due to the different collector-emitter voltages of the transistors Q1–Q2 of the transfer circuit 200, the betas of the transistors Q1–Q2 may be different, thereby causing an error in the base current cancellation. Further, the transfer circuit 200 is normally not suited for use with low power supply voltages due to the additional voltage drop across the transistor Q2. Moreover, the inverting and non-inverting inputs INn and INp of the transfer circuit 200 may be imbalanced, thereby exacerbating the base current cancellation error. In addition, in the event a boosted stage configuration of the transfer circuit 200 is employed (see, e.g., the transfer circuit 300 of FIG. 3), the additional phase shift created by the transistor Q2 within the local feedback loop of the transfer circuit 300 may degrade the AC performance and adversely affect the stability of the op amp.

It would therefore be desirable to have a two-stage bipolar rail-to-rail op amp including a differential to single-ended transfer circuit that avoids the drawbacks of conventional op amp circuit configurations.

BRIEF SUMMARY OF THE INVENTION

In accordance with the present invention, a two-stage bipolar rail-to-rail operational amplifier (op amp) is provided including a differential to single-ended signal transfer circuit that allows increased open loop gain and improved AC performance, while reducing operating power supply voltage requirements. The differential to single-ended transfer circuit provides highly accurate base current cancellation without lengthening the signal path within the circuit.

In one embodiment, the two-stage bipolar rail-to-rail op amp includes a differential input stage, the differential to single-ended signal transfer circuit, a single-ended second stage, and an output buffer. The differential to single-ended transfer circuit includes a first operational transconductance amplifier (OTA), a second operational amplifier (OPA), first and second controlled current sources, a third current source, and first and second bipolar junction transistors. The inverting and non-inverting inputs INn and INp of the transfer circuit are provided at the inverting input and the non-inverting input, respectively, of the OTA, which is coupled to the first and second controlled current sources to form a current mirror with tracking feedback. The OTA provides sufficient feedback to assure that the voltage difference between the input of the current mirror (i.e., the inverting input INn) and the output of the current mirror (i.e., the non-inverting input INp) is low. The output voltage Vout of the transfer circuit is provided at the emitter of the first transistor, the base of which is connected to the non-inverting input INp. The first transistor is coupled to the third current source in an emitter follower configuration to provide both current gain and impedance matching. The low output impedance of the emitter follower is used to match a low impedance load, such as the input of the single-ended second stage of the two-stage op amp. The base of the second transistor is connected to the inverting input INn. Because the voltage difference between the inverting input INn and the non-inverting input INp is low, the base voltage of the second transistor is substantially equal to that of the first transistor. Further, the OPA is coupled between the respective emitters of the first and second transistors in a voltage follower configuration to assure that the emitter voltage of the second transistor is substantially equal to that of the first transistor.

As a result, the operating points of the first and second transistors are substantially the same. Further, the respective base currents of the first and second transistors substantially cancel one another, thereby allowing the input current of the transfer circuit to be reduced while increasing the input impedance of the circuit. Such base current cancellation is obtained without increasing the length of the signal path within the transfer circuit. Further, the increased input impedance of the transfer circuit is achieved while reducing the parasitic conductance associated with the high impedance node.

By providing high input impedance with reduced parasitic conductance, and by implementing base current cancellation off of the signal path, the presently disclosed differential to single-ended transfer circuit may be incorporated into a two-stage bipolar rail-to-rail op amp to obtain increased open loop gain and improved AC performance.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

A differential to single-ended signal transfer circuit is disclosed that may be employed in a two-stage bipolar rail-to-rail operational amplifier (op amp). The presently disclosed differential to single-ended signal transfer circuit allows the two-stage bipolar rail-to-rail op amp to have increased open loop gain, improved AC performance, and reduced operating power supply voltage requirements.

Figure 1A:
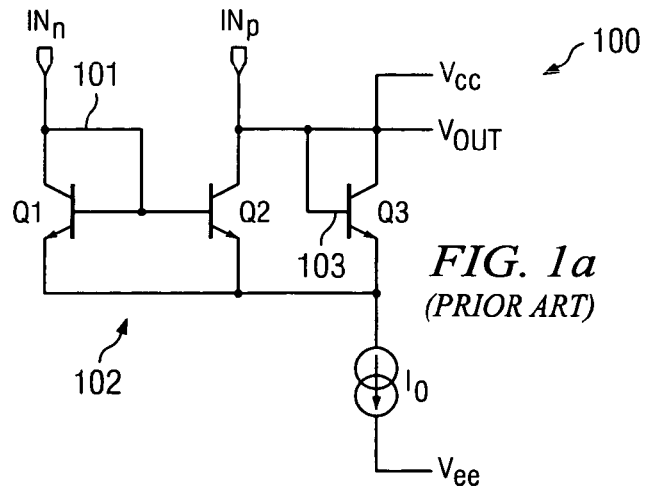
FIG. 1a is a schematic diagram of a conventional differential to single-ended transfer circuit including a current mirror.
Figure 1B:
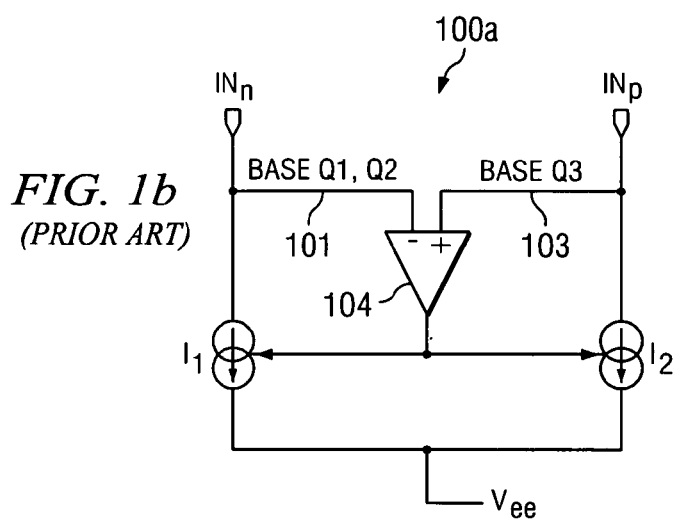
FIG. 1b is a schematic diagram of a generalized implementation of the conventional transfer circuit of FIG. 1a, incorporating a feedback amplifier in the current mirror.
Figure 2:
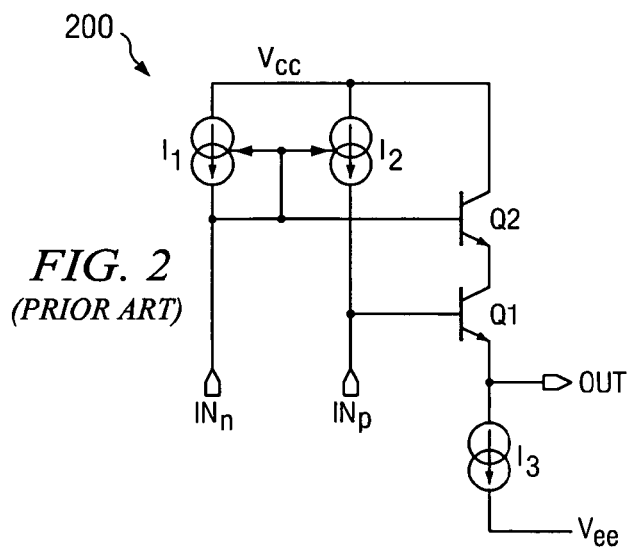
FIG. 2 is a schematic diagram of a conventional differential to single-ended transfer circuit with base current cancellation.
Figure 3:
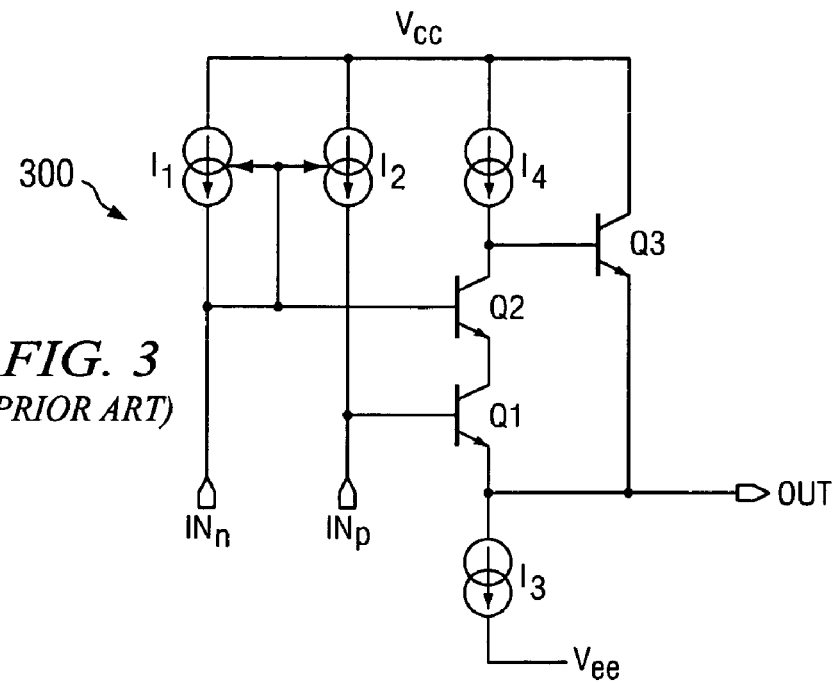
FIG. 3 is a schematic diagram of a boosted stage configuration of the conventional transfer circuit of FIG. 2.
Figure 4:
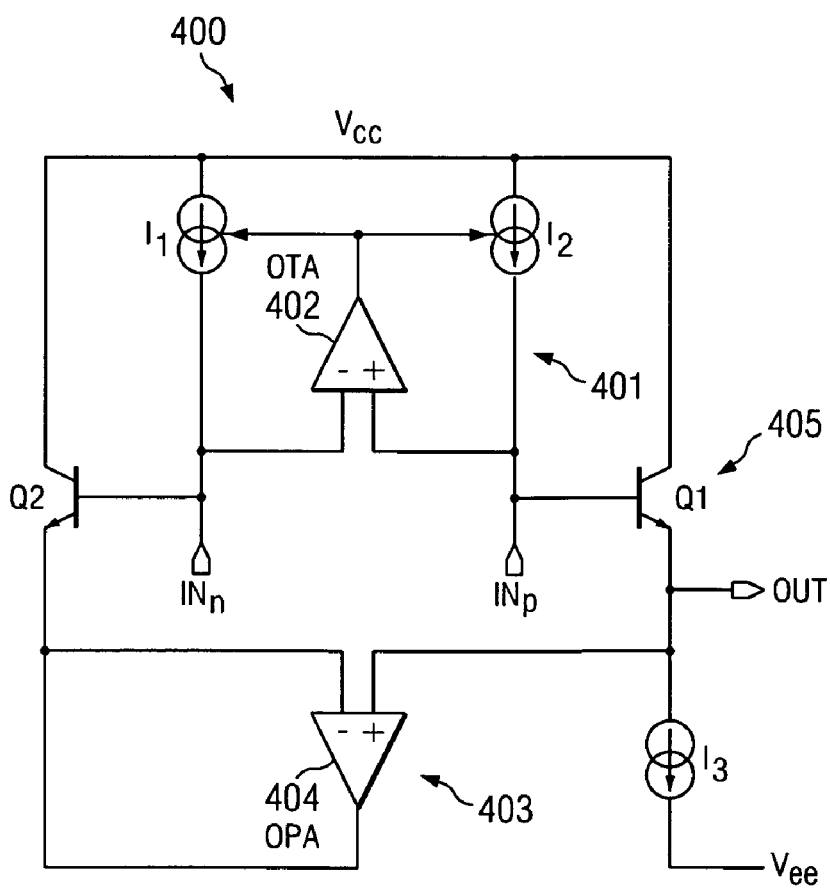
FIG. 4 is a schematic diagram of a differential to single-ended transfer circuit according to the present invention.

FIG. 4 depicts an illustrative embodiment of a differential to single-ended signal transfer circuit 400, in accordance with the present invention. In the illustrated embodiment, the transfer circuit 400 comprises a current mirror 401, a base current cancellation circuit 403, and an output buffer 405. Specifically, the current mirror 401 includes an operational transconductance amplifier (OTA) 402, and first and second controlled current sources $I_1$ and $I_2$. The base current cancellation circuit 403 includes a second operational amplifier (OPA) 404 configured as a voltage follower, and an emitter-follower transistor Q2. The output buffer 405 includes an emitter-follower transistor Q1, and a third current source $I_3$.

In the presently disclosed embodiment, the transfer circuit 400 is implemented on a bipolar integrated circuit (IC). Specifically, the transistors Q1–Q2 comprise respective NPN-type bipolar junction transistors (BJTs), and the OTA 402, the OPA 404, and the current sources $I_1$, $I_2$, and $I_3$ are implemented using the same bipolar IC technology as the BJTs Q1–Q2. It is understood, however, that the various components of the transfer circuit 400 may be implemented using any suitable IC technology. Alternatively, the transistors Q1–Q2, the OTA 402, the OPA 404, and/or the current sources $I_1$, $I_2$, and $I_3$ may be implemented with suitable discrete components.

As shown in FIG. 4, the transfer circuit 400 includes input terminals INn and INp, and an output terminal Vout. Further, the current mirror 401 has an input at the terminal INn and an output at the terminal INp, which correspond to the inverting and non-inverting inputs of the OTA 402, respectively. The current sources $I_1$ and $I_2$ are controlled by the output of the OTA 402, which operates as a feedback amplifier to provide the current mirror 401 with tracking feedback. In the presently disclosed embodiment, the OTA 402 and the controlled current sources $I_1$ and $I_2$ are configured such that the voltage level at the current mirror input (INn) is substantially equal to the voltage level at the current mirror output (INp). As a result, the input and output currents of the current mirror 401 are substantially equal to one another for any given output voltage Vout, thereby making the differential inputs INn and INp of the transfer circuit 400 well balanced.

As described above, the output buffer 405 includes the emitter-follower transistor Q1 and the current source $I_3$. Those of ordinary skill in this art will appreciate that such an emitter follower circuit configuration provides both current gain and impedance matching. For example, the emitter current of the emitter-follower transistor Q1 is typically about 100 times the base current of the transistor Q1. Accordingly, the input impedance of the output buffer 405 is significantly greater than the output impedance of the buffer 405, thereby allowing the output Vout of the transfer circuit 400 to match a low impedance load.

Moreover, the base current cancellation circuit 403 includes the OPA 404 and the emitter-follower transistor Q2. As described above, the OPA 404 is coupled between the respective emitters of the transistors Q1–Q2 as a voltage follower, thereby assuring that the emitter voltage of the transistor Q2 is substantially equal to the emitter voltage of the transistor Q1. Further, because the voltage level at the input INn is substantially equal to the voltage level at the input INp, the base voltages of the transistors Q1–Q2 are substantially equal to one another. As a result, the operating points of the emitter-follower transistors Q1–Q2 are substantially the same, and the base currents of the transistors Q1–Q2 are substantially equal and therefore cancel one another. In this way, the input impedance of the transfer circuit 400 is increased.

Figure 5:
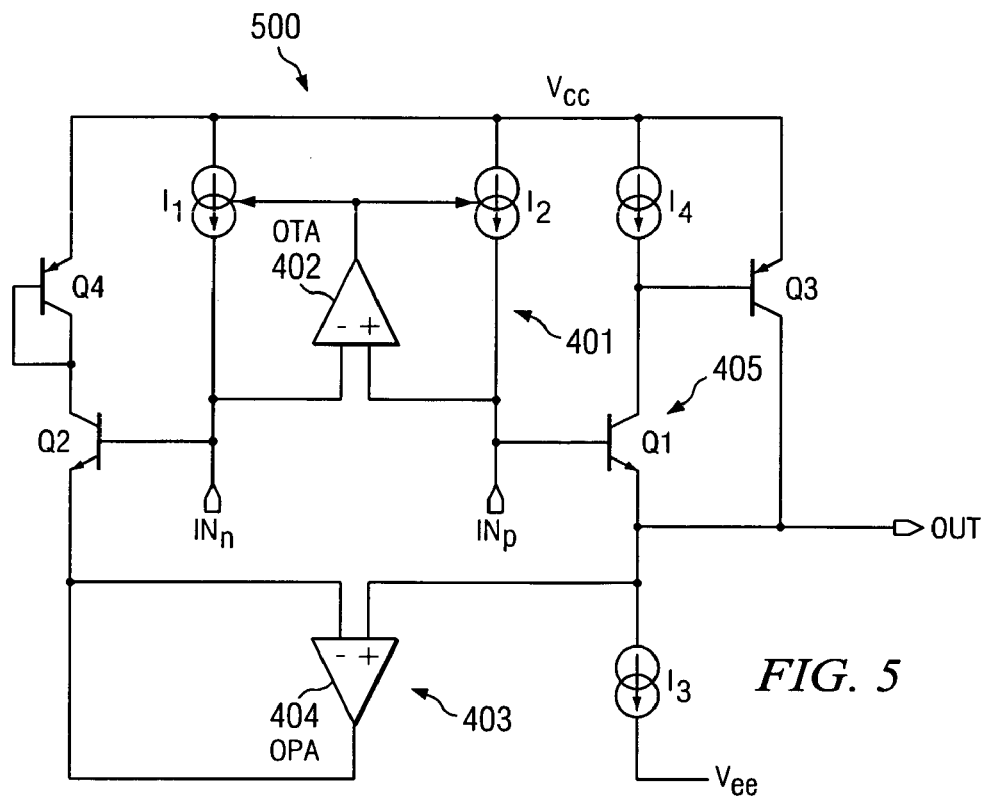
FIG. 5 is a schematic diagram of an alternative embodiment of the transfer circuit of FIG. 4 providing increased current gain.

FIG. 5 depicts an alternative embodiment 500 of the differential to single-ended signal transfer circuit 400 (see FIG. 4). Like the transfer circuit 400, the transfer circuit 500 comprises the current mirror 401, the base current cancellation circuit 403, and the output buffer 405. The transfer circuit 500 further includes transistors Q3 and Q4, and a fourth current source $I_4$. In the illustrated embodiment, the transistors Q3 and Q4 comprise respective PNP-type bipolar junction transistors (BJTs), and the current source $I_4$ is implemented using the same bipolar IC technology as the BJTs Q1–Q4.

Specifically, the transistor Q3 and the current source $I_4$ are configured to boost the current gain of the output buffer 405 including the transistor Q1. Further, because the addition of the transistor Q3 and the current source $I_4$ may change the collector voltage of the transistor Q1, the diode-connected transistor Q4 is added to the transfer circuit 500 and configured to assure that the collector voltage of the transistor Q2 is substantially equal to that of the transistor Q1.

Figure 6:
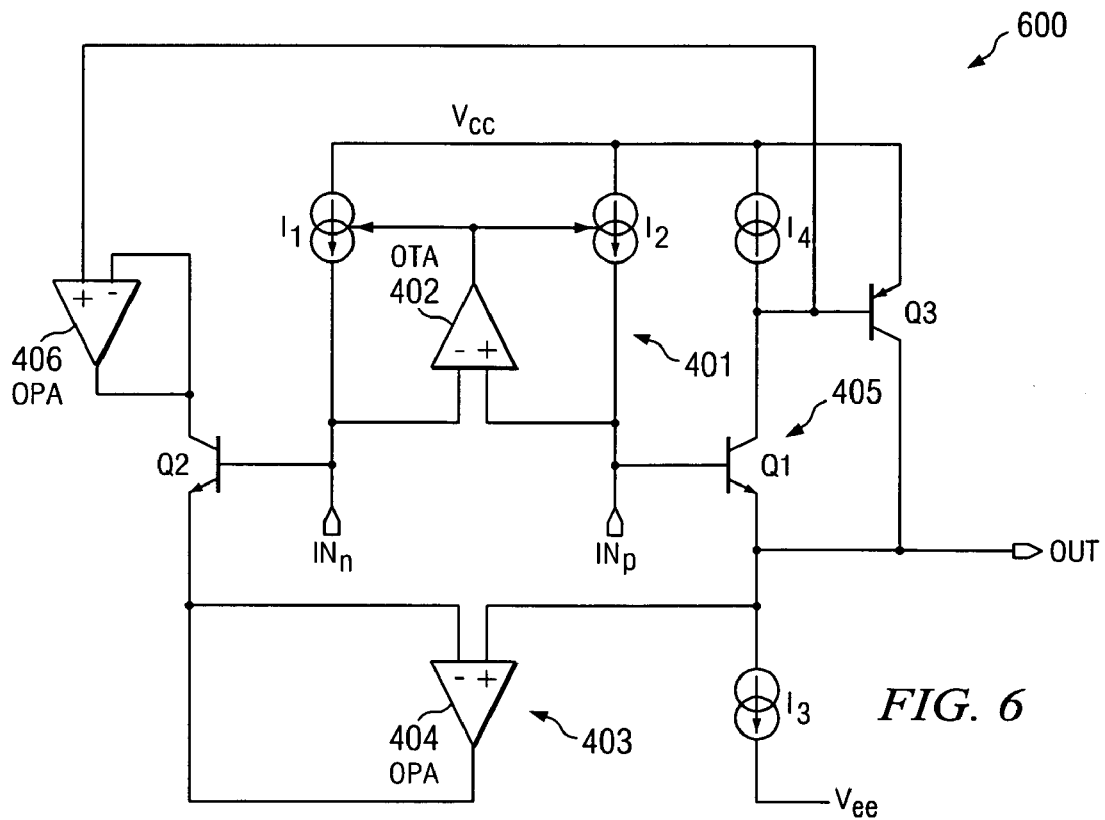
FIG. 6 is a schematic diagram of an alternative embodiment of the transfer circuit of FIG. 5.

FIG. 6 depicts an alternative embodiment 600 of the differential to single-ended signal transfer circuit 500 (see FIG. 5). Like the transfer circuit 500, the transfer circuit 600 comprises the current mirror 401, the base current cancellation circuit 403, the output buffer 405, the transistor Q3, and the current source $I_4$. However, in place of the diode-connected transistor Q4 included in the transfer circuit 500, the transfer circuit 600 includes a third operational amplifier (OPA) 406 coupled between the respective collectors of the transistors Q1–Q2 as a voltage follower, thereby assuring that the collector voltage of the transistor Q2 is substantially equal to the collector voltage of the transistor Q1.

Figure 7:
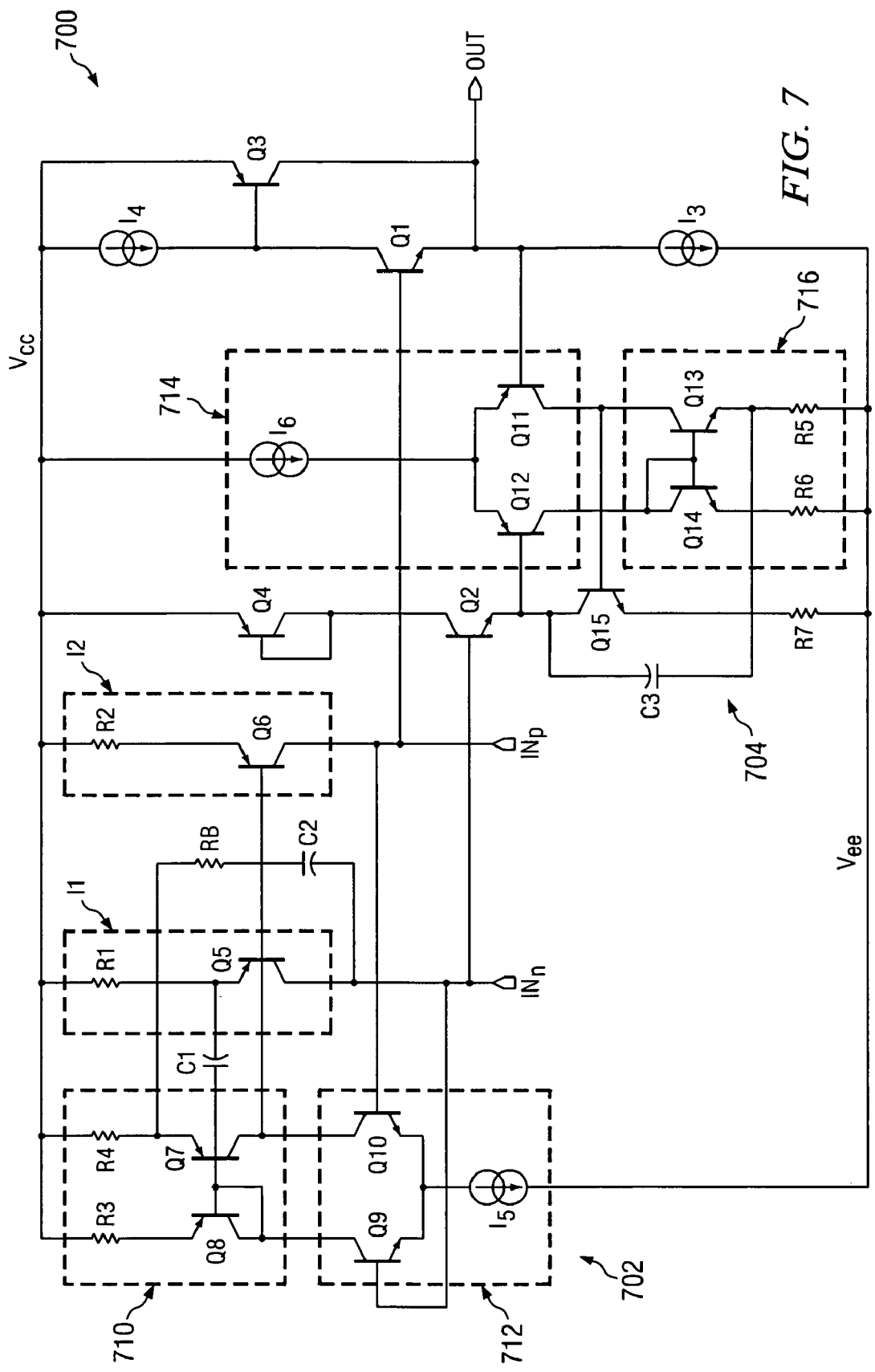
FIG. 7 is a schematic diagram of a detailed view of the transfer circuit of FIG. 5, including frequency compensation.

FIG. 7 depicts a detailed view 700 of the transfer circuit 500 (see FIG. 5). In the illustrated embodiment, a first circuit portion 702 corresponds to the OTA 402 (see FIGS. 4–5), and a second circuit portion 704 corresponds to the OPA 404 (see FIGS. 4–5). Specifically, the OTA 702 comprises a differential stage 712 and a current mirror 710. The differential stage 712 includes NPN-type BJTs Q9 and Q10 and a current source $I_5$. Further, the current mirror 710 includes a diode-connected input transistor Q8 and an output transistor Q7 coupled to the transistor Q8, and emitter degeneration resistors R3 and R4 coupled between the transistors Q8 and Q7 and the power supply voltage Vcc, respectively.

The OPA 704 comprises a differential stage 714 and a current mirror 716. The differential stage 714 includes PNP-type BJTs Q11 and Q12 and a current source $I_6$. Further, the current mirror 716 includes a diode-connected input transistor Q14 and an output transistor Q13 coupled to the transistor Q14, and emitter degeneration resistors R5 and R6 coupled between the transistors Q13 and Q14 and the power supply voltage Vee, respectively. The OPA 704 further includes an output transistor Q15, and an emitter degeneration resistor R7 coupled between the transistor Q15 and the supply voltage Vee.

The transfer circuit 700 also comprises the controlled current sources $I_1$–$I_2$ (see also FIGS. 4–5). As shown in FIG. 7, the current source $I_1$ includes an output transistor Q5, and an emitter degeneration resistor R1 coupled between the transistor Q5 and the supply voltage Vcc. Similarly, the current source $I_2$ includes an output transistor Q6, and an emitter degeneration resistor R2 coupled between the transistor Q6 and the supply voltage Vcc. It is noted that capacitors C1, C2, and C3 and a resistor R8 are included in the transfer circuit 700 to provide frequency compensation.

Figure 8:
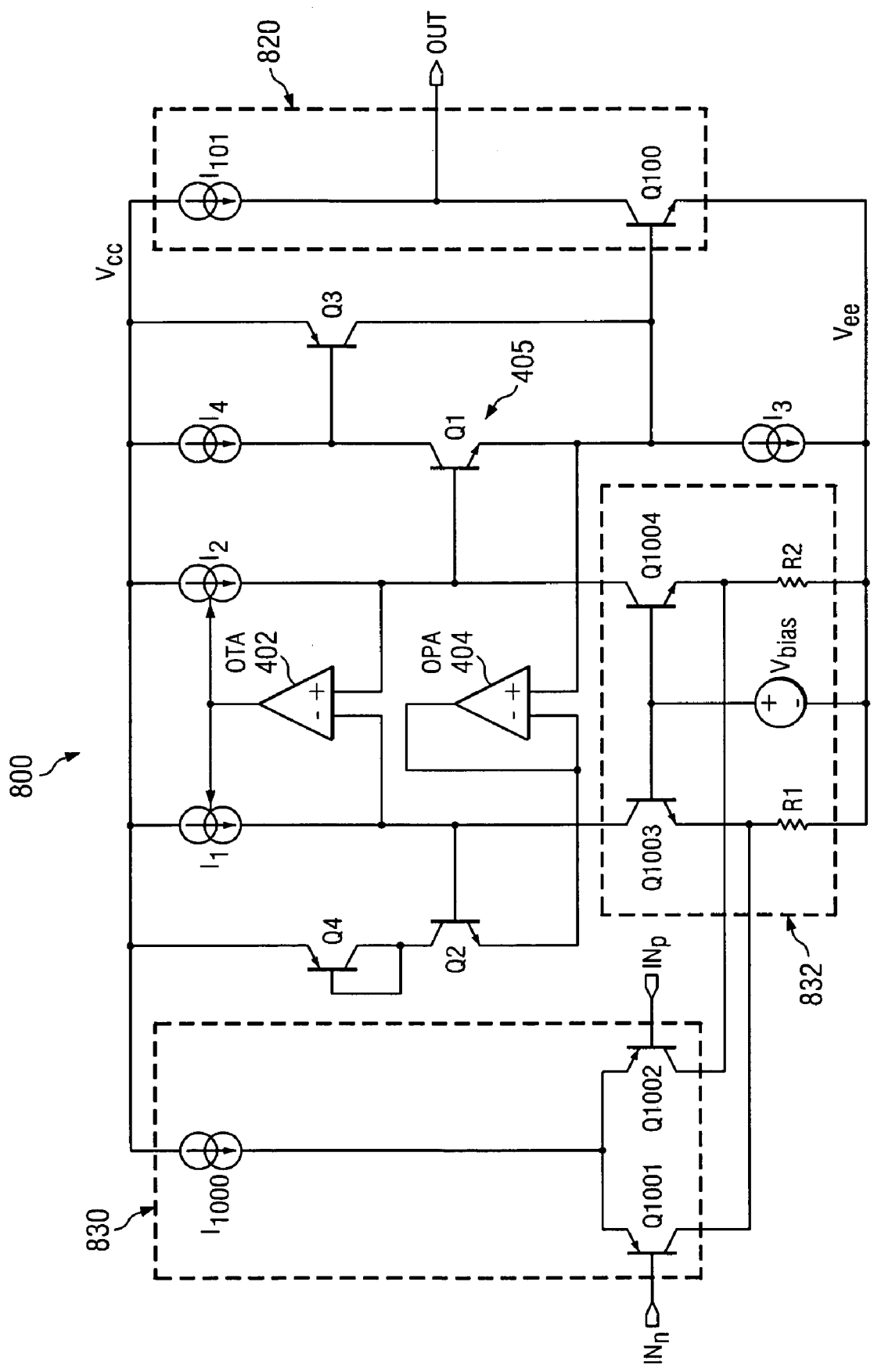
FIG. 8 is a schematic diagram of an alternative embodiment of the transfer circuit of FIG. 5 including a class-A output stage.

FIG. 8 depicts an alternative embodiment 800 of the differential to single-ended signal transfer circuit 500 (see FIG. 5). Like the transfer circuit 500, the transfer circuit 800 comprises the OTA 402, the OPA 404, and the output buffer 405. The transfer circuit 800 further comprises a differential input stage 830, a folded cascode section 832, and a class-A output stage 820 coupled to the output buffer 405. The differential input stage 830 includes PNP-type BJTs Q1001 and Q1002, and a current source $I_{1000}$. The folded cascode section 832 includes NPN-type BJTs Q1003 and Q1004 biased by a voltage source Vbias, and emitter degeneration resistors R1–R2 coupled between the transistors 1003–1004 and the supply voltage Vee, respectively. The class-A output stage 820 includes an emitter-follower transistor Q100, and a current source $I_{101}$.

Figure 9:
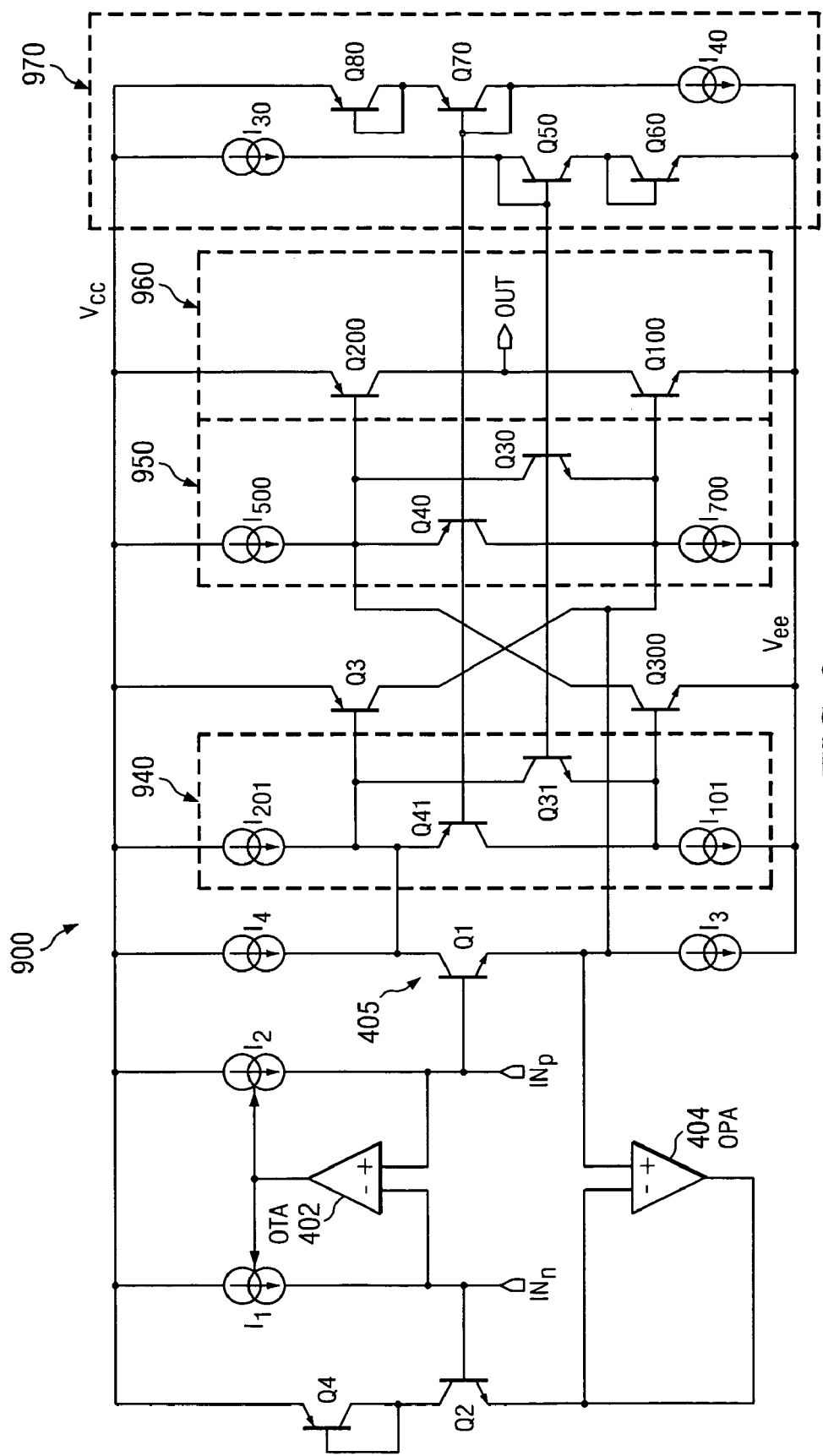
FIG. 9 is a schematic diagram of an alternative embodiment of the transfer circuit of FIG. 5 including a class-AB output stage.

FIG. 9 depicts an alternative embodiment 900 of the differential to single-ended signal transfer circuit 500 (see FIG. 5), in which the current gain boost PNP-type BJT Q3 is accompanied by an NPN-type BJT Q300. The transfer circuit 900 further includes a first AB-control circuit 940, a second AB-control circuit 950, an output stage 960, and a reference voltage source (REF) 970. The circuit portion 940 includes an NPN-type BJT Q31, a PNP-type BJT Q41, and current sources $I_{101}$ and $I_{201}$ interconnected to form the first AB-control circuit 940. The circuit portion 950 includes an NPN-type BJT Q30, a PNP-type BJT Q40, and current sources $I_{100}$ and $I_{200}$ interconnected to form the second AB-control circuit 950. The output stage 960 includes complementary transistors Q100 and Q200. As shown in FIG. 9, the base of the output transistor Q100 is driven by the emitter of the transistor Q1 and the collector of the transistor Q3. Further, the base of the output transistor Q200 is driven by the collector of the transistor Q300 and the emitter of the transistor Q1 via the transistor Q30, which operates as a current follower.

The REF 970 includes diode-connected NPN-type BJTs Q50 and Q60, diode-connected PNP-type BJTs Q70 and Q80, and current sources $I_{30}$ and $I_{40}$. The current source $I_{30}$ is coupled between the diode-connected transistors Q50 and Q60 and the supply voltage Vcc, and the current source $I_{40}$ is coupled between the diode-connected transistors Q60 and Q70 and the supply voltage Vee. The respective bases of the transistors Q30–Q31 are connected to the base of the transistor Q50, thereby setting the respective base voltages to Vee+2*Vbe. The respective bases of the transistors Q40–Q41 are connected to the base of the transistor Q70, thereby setting the respective base voltages to Vcc−2*Vbe.

Figure 10:
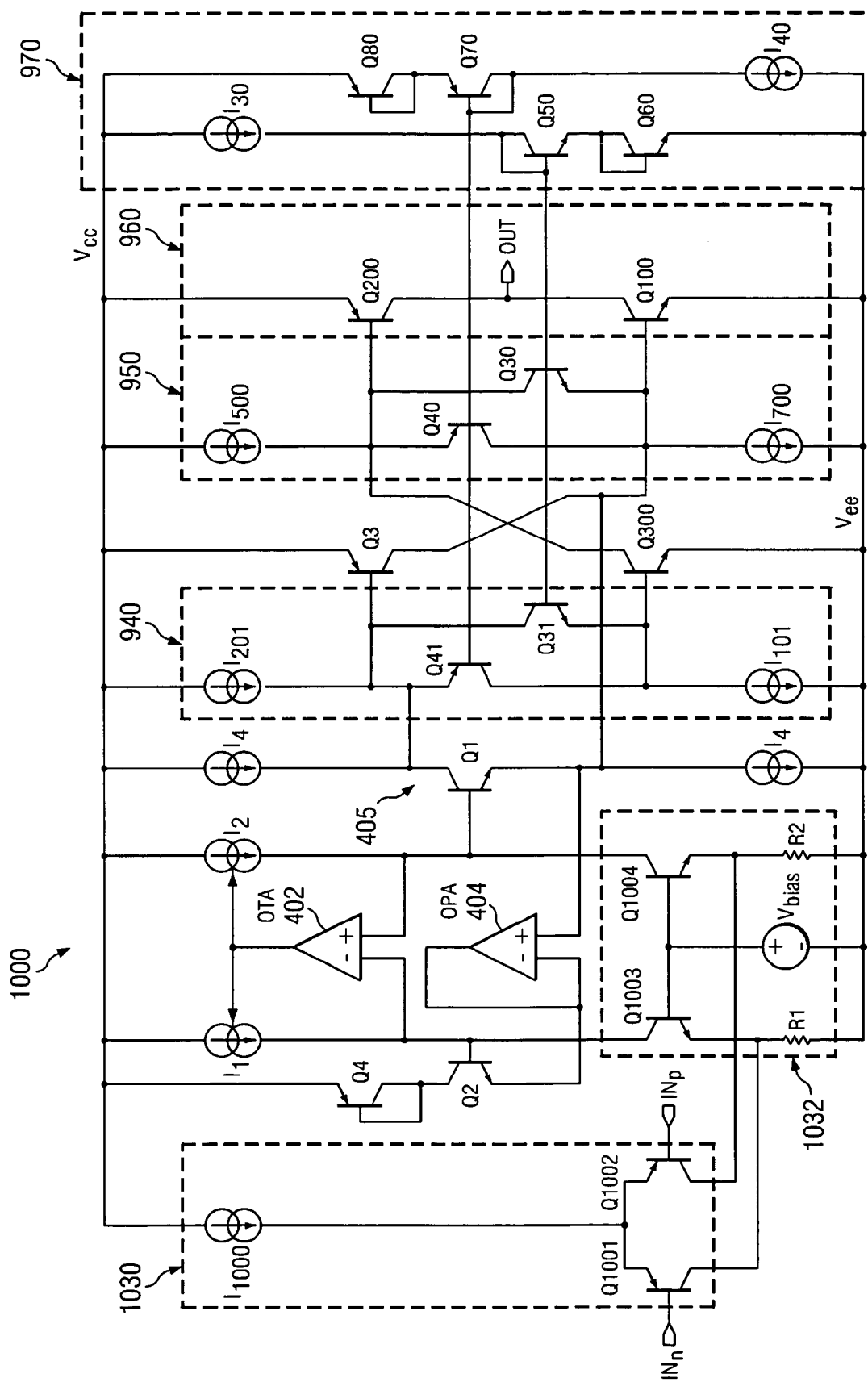
FIG. 10 is a schematic diagram of an alternative embodiment of the transfer circuit of FIG. 9.

FIG. 10 depicts an alternative embodiment 1000 of the differential to single-ended signal transfer circuit 900 (see FIG. 9). Like the transfer circuit 900, the transfer circuit 1000 includes the current gain boost PNP-type BJT Q3 accompanied by the NPN-type BJT Q300, the first AB-control circuit 940, the second AB-control circuit 950, the output stage 960, and the REF 970. The transfer circuit 1000 further includes a differential input stage 1030, and a folded cascode section 1032. The differential input stage 1030 includes the PNP-type BJTs Q1001 and Q1002, and the current source $I_{1000}$. The folded cascode section 1032 includes the NPN-type BJTs Q1003 and Q1004 biased by the voltage source Vbias, and the emitter degeneration resistors R1–R2 coupled between the transistors 1003–1004 and the supply voltage Vee, respectively.

It will be appreciated by those of ordinary skill in the art that modifications to and variations of the above-described bipolar differential to single-ended transfer circuit with gain boost may be made without departing from the inventive concepts disclosed herein. Accordingly, the invention should not be viewed as limited except as by the scope and spirit of the appended claims.

What is claimed is:

1. A differential to single-ended signal transfer circuit, comprising:
   first and second differential signal inputs;
   a single-ended signal output;
   a current mirror having an input and an output, the first differential input corresponding to the current mirror input, and the second differential input corresponding to the current mirror output, wherein the current mirror further includes a feedback loop coupled between the current mirror input and the current mirror output, the feedback loop being configured to cause an input voltage level at the current mirror input to be substantially equal to an output voltage level at the current mirror output;
   an output buffer including a first emitter-follower transistor and a first current source, the first transistor having a collector connected to a first power supply voltage, a base connected to the second differential input, and an emitter connected to the single-ended output, the first current source being connected between the emitter of the first transistor and a second power supply voltage; and
   a base current cancellation circuit including a second emitter-follower transistor and a first amplifier configured as a voltage follower, the second transistor having a collector connected to the first supply voltage, a base connected to the first differential input, and an emitter, the voltage follower having an input connected to the emitter of the first transistor and an output connected to the emitter of the second transistor.

2. The transfer circuit of claim 1 wherein the current mirror includes an operational transconductance amplifier (OTA), and second and third controlled current sources, the OTA having an inverting input coupled to the first differential input, a non-inverting input coupled to the second differential input, and an output controlling the second and third current sources, the second current source being connected between the first supply voltage and the first differential input, and the third current source being connected between the first supply voltage and the second differential input.

3. The transfer circuit of claim 1 wherein the voltage follower comprises a second operational amplifier having an inverting input, a non-inverting input, and an output, the non-inverting input of the second operational amplifier being connected to the emitter of the first transistor, the inverting input and the output of the second operational amplifier being connected to the emitter of the second transistor.

4. The transfer circuit of claim 1 further including
   a third PNP-type transistor having a base, a collector, and an emitter, the base of the third transistor being connected to the collector of the first transistor, the collector of the third transistor being connected to the emitter of the first transistor, and the emitter of the third transistor being connected to the first supply voltage,
   a fourth PNP-type diode-connected transistor coupled between the collector of the second transistor and the first supply voltage, and
   a fourth current source coupled between the collector of the first transistor and the first supply voltage.

5. The transfer circuit of claim 1 further including
   a third PNP-type transistor having a base, a collector, and an emitter, the base of the third transistor being connected to the collector of the first transistor, the collector of the third transistor being connected to the emitter of the first transistor, and the emitter of the third transistor being connected to the first supply voltage,
   a fourth current source coupled between the collector of the first transistor and the first supply voltage, and
   a second operational amplifier having a non-inverting input connected to the collector of the first transistor, and an inverting input and an output connected to the collector of the second transistor.

* * * * *